(12) United States Patent  
Park et al.

(10) Patent No.: US 8,581,244 B2
(45) Date of Patent: Nov. 12, 2013

(54) OXIDE THIN FILM TRANSISTORS AND METHODS OF MANUFACTURING THE SAME

(75) Inventors: Joon Seok Park, Seongnam-si (KR); Tae Sang Kim, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 337 days.

(21) Appl. No.: 13/004,981

(22) Filed: Jan. 12, 2011

(65) Prior Publication Data

US 2011/0169006 A1    Jul. 14, 2011

(30) Foreign Application Priority Data

Jan. 12, 2010   (KR) .................. 10-2010-0002747

(51) Int. Cl.
*H01L 29/786* (2006.01)
*H01L 21/34* (2006.01)

(52) U.S. Cl.
USPC ............... 257/43; 257/E29.296; 257/E21.46; 438/104

(58) Field of Classification Search
USPC ............... 257/43, E21.46, E29.296; 438/104
See application file for complete search history.

(56) References Cited

U.S. PATENT DOCUMENTS

2010/0025677 A1*   2/2010   Yamazaki et al. ............. 257/43
2010/0117086 A1*   5/2010   Akimoto et al. ............. 257/57

FOREIGN PATENT DOCUMENTS

| JP | 07211919 A | 8/1995 |
| JP | 2008166716 A | 7/2008 |
| KR | 1020090059494 | 6/2009 |

\* cited by examiner

*Primary Examiner* — Julio J Maldonado
*Assistant Examiner* — Daniel Shook
(74) *Attorney, Agent, or Firm* — Harness, Dickey & Pierce, P.L.C.

(57) ABSTRACT

Example embodiments are directed to oxide thin film transistors and methods of manufacturing the oxide thin film transistors. The oxide thin film transistor includes an active region in a gate insulation layer and under a source and a drain in a bottom gate structure, thus improving electrical characteristics of the oxide thin film transistor.

19 Claims, 7 Drawing Sheets

OXIDE THIN FILM TRANSISTORS AND METHODS OF MANUFACTURING THE SAME

CROSS-REFERENCE TO RELATED APPLICATIONS

This application claims priority under U.S.C. §119 to Korean Patent Application No. 10-2010-0002747, filed on Jan. 12, 2010, in the Korean Intellectual Property Office, the disclosure of which is incorporated herein in its entirety by reference.

BACKGROUND

1. Field

Example embodiments relate to oxide thin film transistors, and more particularly, to oxide thin film transistors including an active region extending under a source and a drain in a bottom gate structure to improve electrical characteristics of the oxide thin film transistors, and methods of manufacturing the oxide thin film transistors.

2. Description of the Related Art

Thin film transistors are used as switching and/or driving devices in various display and other application areas, and are also used, for example, as selection switches of cross point-type memory devices.

While liquid crystal displays (LCDs) are widely used as television panels, recently organic light emitting displays are used in televisions. Television display technologies are being developed to satisfy market demands, such as those for large-scale televisions or digital information displays (DIDs), low-cost products, and high picture quality (in terms of moving image expression, high definition, brightness, contrast, and color reproduction). To satisfy these demands, large substrates formed of glass, for example, and high performance thin film transistors (TFTs) as switching and driving devices in displays are used.

SUMMARY

According to example embodiments, an oxide thin film transistor includes a substrate; a gate on a region of the substrate; a gate insulation layer on the substrate and the gate; a source on the gate insulation layer; a drain on the gate insulation layer; and an active region on the gate insulation layer between the source and the drain and extending under at least one of the source and the drain.

According to example embodiments, the gate insulation layer has a single-layered structure or a multi-layered structure.

According to example embodiments, the gate insulation layer has the multi-layered structure, and layers constituting the gate insulation layer include materials having different etching characteristics.

According to example embodiments, the gate insulation layer includes a first gate insulation layer and a second gate insulation layer, and the first gate insulation layer includes hafnium (Hf) oxide.

According to example embodiments, the gate insulation layer includes a first gate insulation layer and a second gate insulation layer, and the second gate insulation layer includes at least one of silicon (Si) oxide and Si nitride.

According to example embodiments, a distance between a lower surface of the active region and lower surfaces of the source and the drain ranges from about 20 nm to about 100 nm.

According to example embodiments, a distance between a top surface of the gate and a lower surface of the active region ranges from about 100 nm to about 400 nm.

According to example embodiments, a method of manufacturing an oxide thin film transistor includes forming a gate on a region of a substrate; forming a gate insulation layer on the substrate and the gate; forming a source and a drain on the gate insulation layer; etching the gate insulation layer between the source and the drain; and forming an active region in the etched region of the gate insulation layer.

According to example embodiments, the gate insulation layer has a single-layered structure or a multi-layered structure.

According to example embodiments, the gate insulation layer has the multi-layered structure, and layers constituting the gate insulation layer include materials having different etching characteristics.

According to example embodiments, the gate insulation layer includes a first gate insulation layer and a second gate insulation layer, and etching the gate insulation layer includes etching only the second gate insulation layer.

According to example embodiments, the second gate insulation layer has a thickness ranging from about 20 nm to about 100 nm.

According to example embodiments, forming the gate insulation layer includes forming a first gate insulation layer including hafnium (Hf) oxide on the substrate and the gate; and forming a second gate insulation layer on the first gate insulation layer.

According to example embodiments, forming the gate insulation layer includes forming a first gate insulation layer on the substrate and the gate; and forming a second gate insulation layer including silicon (Si) oxide or Si nitride on the first gate insulation layer.

According to example embodiments, etching the gate insulation layer includes etching only the second gate insulation layer using buffered oxide etchant (BOE).

According to example embodiments, the gate insulation layer is etched to a depth ranging from about 20 nm to about 100 nm.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the tee ins first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
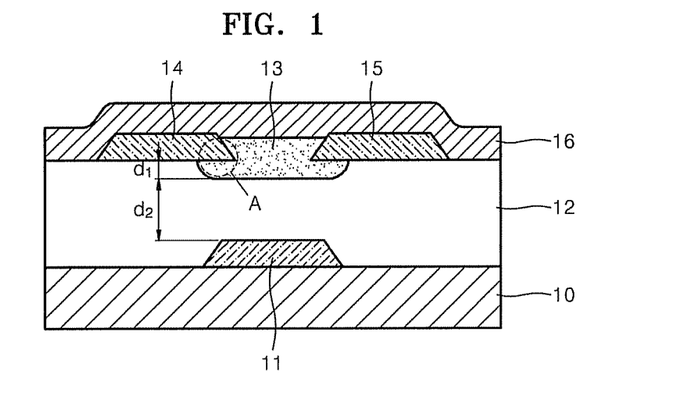
FIG. 1 is a cross-sectional view illustrating an oxide thin film transistor according to an example embodiment.

FIG. 1 is a cross-sectional view illustrating an oxide thin film transistor according to an example embodiment.

Referring to FIG. 1, a gate 11 is disposed on a region of a substrate 10, and a gate insulation layer 12 is disposed on the substrate 10 and the gate 11. A source 14 and/or a drain 15 partially overlap the gate insulation layer 12, and are spaced apart from each other. An active region 13 is disposed between the source 14 and the drain 15, and extends under the source 14 and the lower side of the drain 15. A passivation layer 16 may be disposed on the gate insulation layer 12, the active region 13, the source 14, and/or the drain 15.

Since the active region 13 is disposed between the source 14 and the drain 15, and extends under the source 14 and the drain 15, regions A in which an electric field generated by the gate 11 during a device driving operation overlaps the source 14 and the drain 15 are relatively bigger in size. Accordingly, a channel is formed with relative ease in the active region 13, thus improving electrical characteristics of the oxide thin film transistor. If the active region 13 is disposed only between the source 14 and the drain 15, regions in which an electrical field generated by a voltage of the gate 11 overlaps the source 14 and the drain 15 are relatively small, so that the formation efficiency of a channel in the active region 13 is reduced.

Thus, in a bottom gate structure oxide thin film transistor, the active region 13 disposed between the source 14 and the drain 15 is formed in predetermined/desired regions under the source 14 and the drain 15. A distance d1 between the lower surface of the active region 13 and the lower surfaces of the source 14 and the drain 15 may range from about 20 nm to about 100 nm, and a distance d2 between a top surface of the gate 11 and the lower surface of the active region 13 may range from about 100 nm to about 400 nm.

Figure 2:
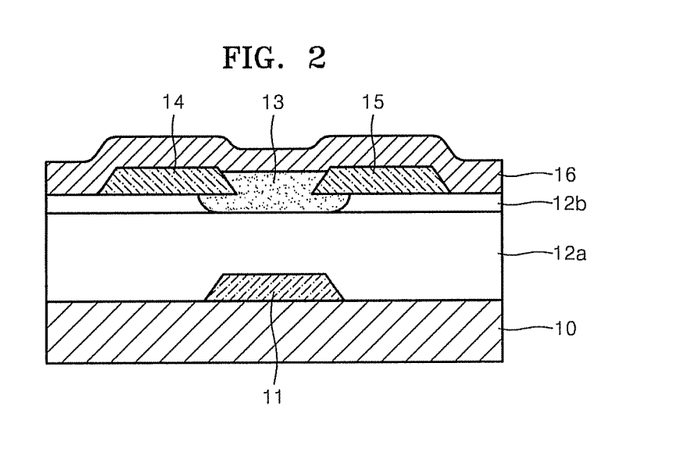
FIG. 2 is a cross-sectional view illustrating an oxide thin film transistor including a gate insulation layer having a multi-layered structure, according to an example embodiment.

In example embodiments, the gate insulation layer 12 may have a single-layered structure or a multi-layered structure. FIG. 2 is a cross-sectional view illustrating an oxide thin film transistor including a gate insulation layer having a multi-layered structure, according to an example embodiment.

Referring to FIG. 2, the gate 11 is disposed on a region of the substrate 10, and the active region 13 is disposed on a first gate insulation layer 12a in a region corresponding to the gate 11, and a second gate insulation layer 12b is disposed on the first gate insulation layer 12a at sides of the active region 13. The source 14 and the drain 15 are disposed on the second gate insulation layer 12b. As in the structure of FIG. 1, the active region 13 is disposed between the source 14 and the drain 15, and extends under the source 14 and/or the drain 15. The second gate insulation layer 12b may have a thickness ranging from about 20 nm to about 100 nm. The passivation layer 16 may be disposed on the second gate insulation layer 12b, the active region 13, the source 14, and/or the drain 15.

Materials of the layers constituting the oxide thin film transistors illustrated in FIGS. 1 and 2 will now be described.

A substrate comprising, for example, silicon (Si), glass, a semiconductor compound, and/or an organic material may be used as the substrate 10. An insulation layer (not shown) may be disposed on the substrate 10. For example, the surface of a silicon substrate may be thermally oxidized to form a silicon oxide.

The gate 11 is formed of a conductive material on a region of the substrate 10. For example, the gate 11 may be formed of a metal and/or a conductive metal oxide.

The gate insulation layer 12 and the first and second gate insulation layers 12a and 12b may be formed of insulating materials, for example, may be formed of oxides and/or nitrides. In detail, the gate insulation layer 12 and the first and second gate insulation layers 12a and 12b may be formed of one of $SiO_2$, $HfO_2$, $Al_2O_3$, $Si_3N_4$, and a combination thereof. As illustrated in FIG. 2, when the first and second gate insulation layers 12a and 12b constitute a multi-layered structure, the first and second gate insulation layers 12a and 12b may be formed of different materials, particularly, of materials having different etching characteristics.

The source 14 and the drain 15 may be formed of a conductive material such as a metal and/or a conductive metal oxide. In detail, the source 14 and the drain 15 may be formed of a metal such as platinum (Pt), ruthenium (Ru), gold (Au), silver (Ag), molybdenum (Mo), aluminum (Al), tungsten (W), or copper (Cu), or be formed of a conductive metal oxide such as In-tin-oxide (ITO), InZnO (IZO), or AlZnO (AZO).

The active region 13 may be formed of any material for a channel of an oxide thin film transistor, but is not limited thereto. For example, the active region 13 may be formed of a Zn oxide-based material that is obtained by adding an organic material to one of a Zn oxide, an In—Zn oxide, and a Ga—In—Zn oxide.

Hereinafter, methods of manufacturing the oxide thin film transistors according to example embodiments of FIGS. 1 and 2 will now be described with reference to the accompanying drawings.

FIGS. 3A through 3E are cross-sectional views illustrating a method of manufacturing the oxide thin film transistor illustrated in FIG. 1, according to an example embodiment.

Figure 3A:
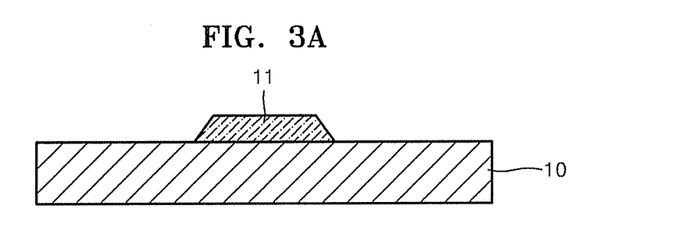
FIGS. 3A through 3E are cross-sectional views illustrating a method of manufacturing the oxide thin film transistor illustrated in FIG. 1, according to an example embodiment.

Referring to FIG. 3A, the substrate 10, which may be formed of one of silicon, glass, a semiconductor material, and an organic material, is prepared first. An insulation layer (not shown) may be formed on the substrate 10. For example, a surface of a silicon substrate may be thermally oxidized to form a silicon oxide. Then, a conductive material such as a metal and/or a conductive metal oxide is applied on the substrate 10 and is patterned to form the gate 11. The gate 11 may have a thickness ranging from about 50 nm to about 200 nm, for example.

Figure 3B:
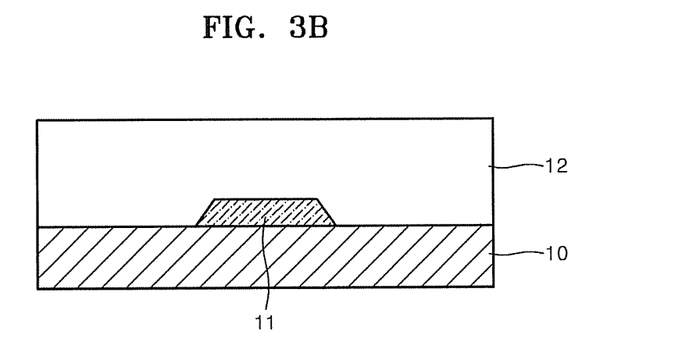

Referring to FIG. 3B, an insulating material is applied on the substrate 10 and the gate 11 to form the gate insulation layer 12. The gate insulation layer 12 may be formed of one of $SiO_2$, $HfO_2$, $Al_2O_3$, $Si_3N_4$, and/or a combination thereof.

Figure 3C:
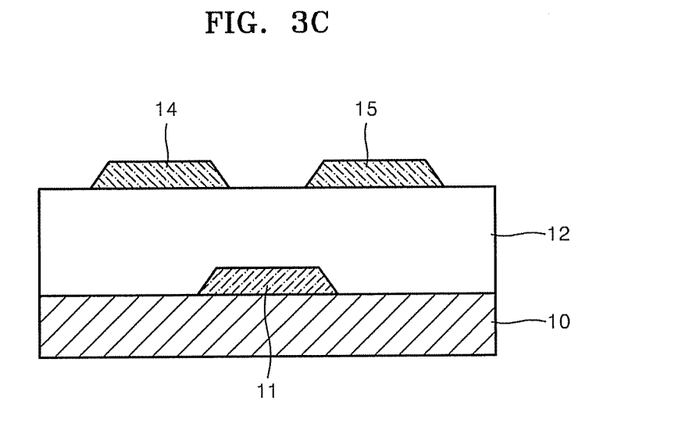
Figure 3D:
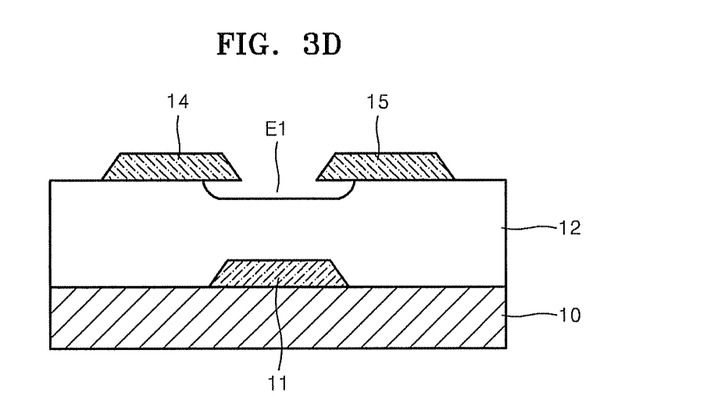
Figure 3E:
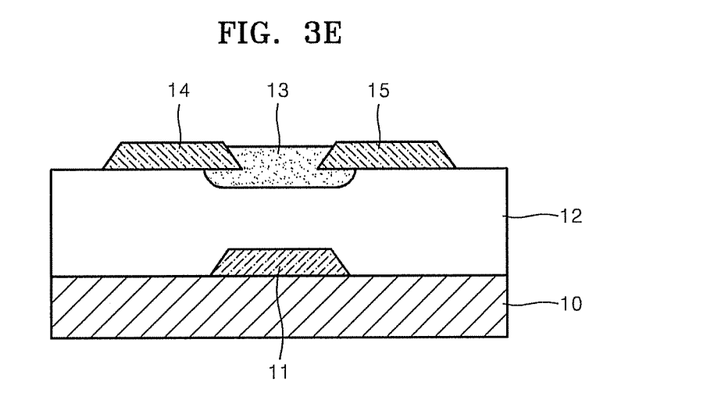

Referring to FIG. 3C, a metal or a conductive metal oxide is applied on the gate insulation layer 12 and is patterned to form the source 14 and the drain 15. Referring to FIG. 3D, the gate insulation layer 12 between the source 14 and the drain 15 is etched. At this point, the gate insulation layer 12 is etched using, for example, an isotropic etching process, so that portions of the gate insulation layer 12, which are under the source 14 and the drain 15, are etched. The gate insulation layer 12 may have an etch depth ranging from about 20 nm to about 100 nm, for example. Thus, a surface of the gate insulation layer 12, and the portions of the gate insulation layer 12 under the source 14 and the drain 15 are etched to form an etch region E1. Referring to FIG. 3E, the active region 13 is formed on the gate insulation layer 12 in the etch region E1 illustrated in FIG. 3D.

FIGS. 4A through 4E are cross-sectional views illustrating a method of manufacturing the oxide thin film transistor illustrated in FIG. 2, according to an example embodiment. In this case, the first and second gate insulation layers 12a and 12b of the oxide thin film transistor constitute a multi-layered structure.

Figure 4A:
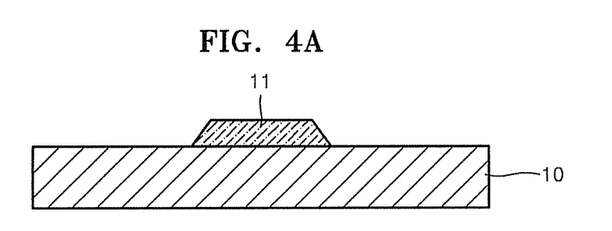
FIGS. 4A through 4E are cross-sectional views illustrating a method of manufacturing the oxide thin film transistor illustrated in FIG. 2, according to an example embodiment.

Referring to FIG. 4A, the substrate 10, which may be formed of one of silicon, glass, a semiconductor material, and an organic material, is prepared first. An insulation layer (not shown) may be formed on the substrate 10. Then, a conductive material such as a metal and/or a conductive metal oxide is applied on the substrate 10 and is patterned to form the gate 11. The gate 11 may have a thickness ranging from about 50 nm to about 200 nm.

Figure 4B:
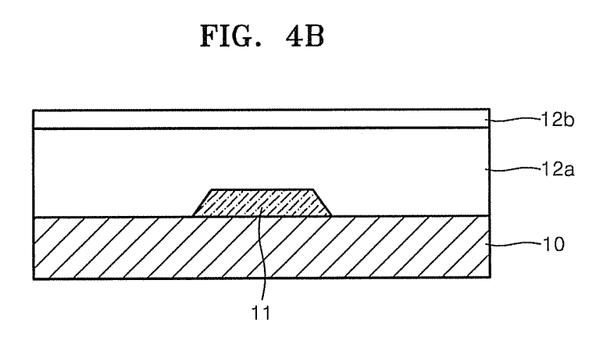

Referring to FIG. 4B, insulating materials are sequentially applied on the substrate 10 and the gate 11 to sequentially form the first gate insulation layer 12a and the second gate insulation layer 12b. The first and second gate insulation layers 12a and 12b may be formed of one of $SiO_2$, $HfO_2$, $Al_2O_3$, $Si_3N_4$, and/or a combination thereof. The first and second gate insulation layers 12a and 12b may be formed of materials having different etching characteristics. For example, the first gate insulation layer 12a may be formed of Hf oxide such as $HfO_x$, HfInO, or HfZnO, where x is a natural number, and the second gate insulation layer 12b may be formed of at least one of a Si oxide and a Si nitride. For example, Hf oxide and a Si oxide or Si nitride are significantly different in etching characteristics. Hf oxide is resistant to etching by buffered oxide etchant (BOE), but Si oxide or Si nitride is easily etched by BOE. The second gate insulation layer 12b may have a thickness ranging from about 20 nm to about 100 nm.

Figure 4C:
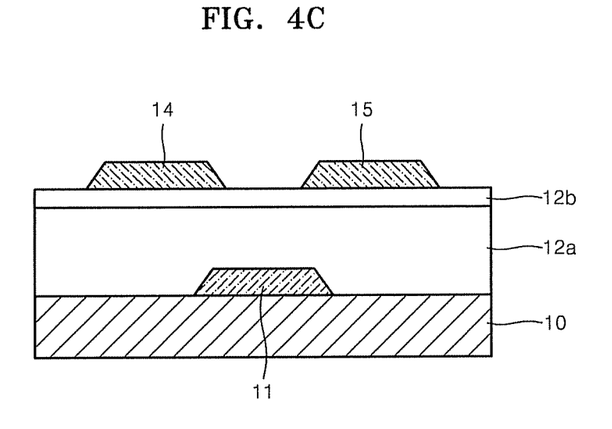

Referring to FIG. 4C, a metal and/or a conductive metal oxide is applied on the second gate insulation layer 12b, and is patterned to form the source 14 and the drain 15.

Figure 4D:
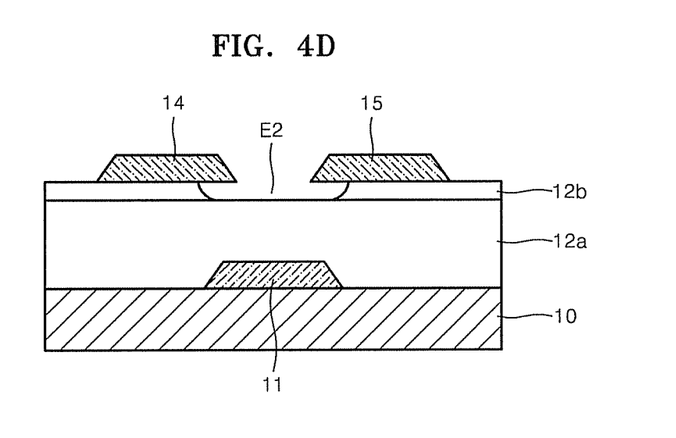

Referring to FIG. 4D, the second gate insulation layer 12b between the source 14 and the drain 15 is etched. Since the second gate insulation layer 12b is formed of a material that is different in etching characteristics from that of the first gate insulation layer 12a, the second gate insulation layer 12b is etched without affecting the first gate insulation layer 12a. For example, when the first gate insulation layer 12a is formed of Hf oxide, and the second gate insulation layer 12b is formed of a Si oxide or a Si nitride, the second gate insulation layer 12b is easily etched by BOE, but the first gate insulation layer 12a is not etched. Since the second gate insulation layer 12b between the source 14 and the drain 15 is etched, for example, using an isotropic etching process, a surface of the first gate insulation layer 12a, and portions of the first gate insulation layer 12a, which are under the source 14 and the drain 15, are etched to form an etch region E2.

Figure 4E:
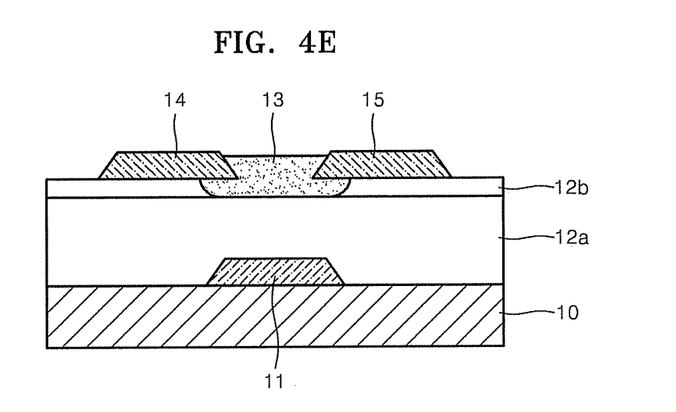

Referring to FIG. 4E, the active region 13 is formed on the first gate insulation layer 12a in the etch region E2 illustrated in FIG. 4D.

Figure 5A:
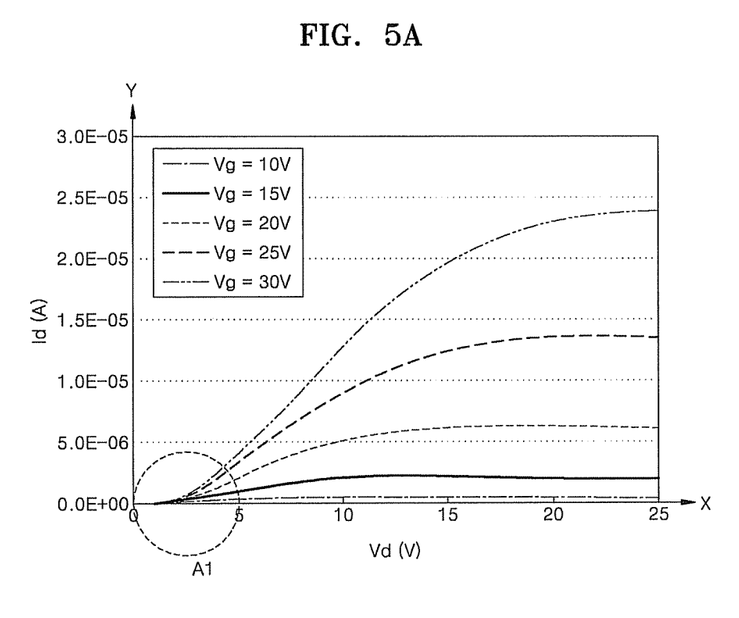
FIGS. 5A and 5B are graphs illustrating drain current Id v/s drain voltage Vd for gate voltages of 10 V, 15 V, 20 V, 25 V, and 30 V that are applied to oxide thin film transistors, according to an example embodiment.
Figure 5B:
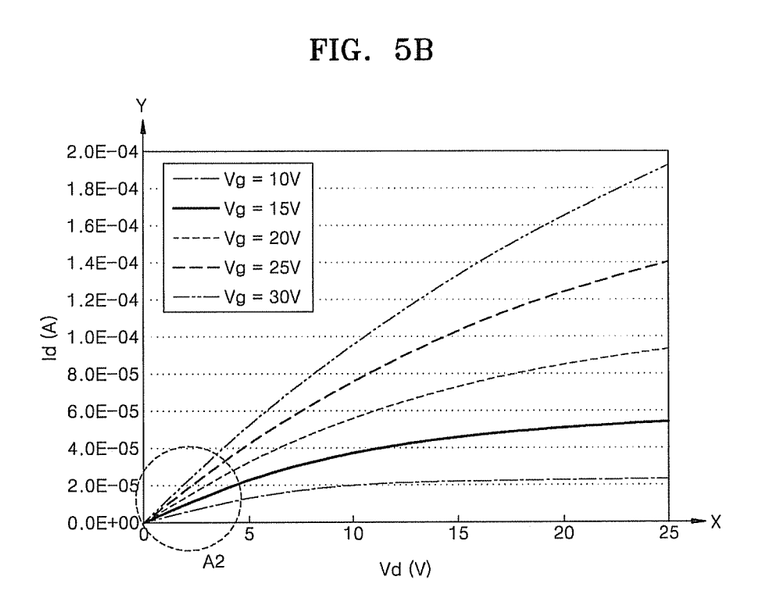

FIGS. 5A and 5B are graphs illustrating drain current Id v/s drain voltage Vd for gate voltages of 10 V, 15 V, 20 V, 25 V, and 30 V that are applied to oxide thin film transistors, according to example embodiments. An X-axis denotes the drain voltage Vd, and a Y-axis denotes the drain current Id.

In the oxide thin film transistor of FIG. 5A, a source and a drain are formed on a gate insulation layer, and an active region is formed between the source and the drain without etching the gate insulation layer. Referring to FIG. 5A, when the drain voltage Vd is supplied in a range from about 0 V to about 2V, the drain current Id does not vary substantially, which is called current crowding. When the oxide thin film transistor exhibiting the current crowding is used in a display device, it may be difficult to express gradation.

In the oxide thin film transistor of FIG. 5B, a gate insulation layer between a source and a drain is etched to form portions of an active region under the source and the drain. Referring to FIG. 5B, even when the drain voltage Vd is applied in the range from about 0 V to about 2V, the drain current Id varies quite substantially according to the gate voltages. When the oxide thin film transistor exhibiting the above variation in the drain current Id is used in a display device, it is relatively easy to express gradation.

As described above, according to the one or more of the above embodiments, the active region of the oxide thin film transistor extends under the source and the drain, thus facilitating channel formation in the active region and improving electrical characteristics of the oxide thin film transistor.

In addition, it will be understood by those of ordinary skill in the art that the oxide thin film transistor is used to manufacture various electronic devices such as a display or a cross point-type memory device. The oxide thin film transistor may also be used as a bottom gate type oxide thin film transistor.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An oxide thin film transistor comprising:
a substrate;
a gate on a region of the substrate;
a gate insulation layer on the substrate and the gate;
a source on the gate insulation layer;
a drain on the gate insulation layer; and
an active region on the gate insulation layer between the source and the drain and extending under at least one of the source and the drain, wherein
the active region at least partially covers a respective sidewall of the source and the drain.

2. The oxide thin film transistor of claim 1, wherein the gate insulation layer has a single-layered structure or a multi-layered structure.

3. The oxide thin film transistor of claim 2, wherein the gate insulation layer has the multi-layered structure, and layers constituting the gate insulation layer include materials having different etching characteristics.

4. The oxide thin film transistor of claim 3, wherein the gate insulation layer includes a first gate insulation layer and a second gate insulation layer, and the first gate insulation layer includes hafnium (Hf) oxide.

5. The oxide thin film transistor of claim 3, wherein the gate insulation layer includes a first gate insulation layer and a second gate insulation layer, and the second gate insulation layer includes at least one of silicon (Si) oxide and Si nitride.

6. The oxide thin film transistor of claim 1, wherein a distance between a lower surface of the active region and lower surfaces of the source and the drain ranges from about 20 nm to about 100 nm.

7. The oxide thin film transistor of claim 1, wherein a distance between a top surface of the gate and a lower surface of the active region ranges from about 100 nm to about 400 nm.

8. The oxide thin film transistor of claim 1, wherein an upper surface of the active region extends above at least one lower surface of the source and the drain.

9. The oxide thin film transistor of claim 1, wherein a lower surface of the active region extends below at least one lowest portion of the source and the drain.

10. The oxide thin film transistor of claim 9, wherein a lower portion of the active region laterally extends under at least one of the source and the drain.

11. A method of manufacturing an oxide thin film transistor, the method comprising:
forming a gate on a region of a substrate;
forming a gate insulation layer on the substrate and the gate;
forming a source and a drain on the gate insulation layer;
etching the gate insulation layer between the source and the drain and at least partially under at least one of the source and the drain; and
forming an active region in the etched region of the gate insulation layer.

12. The method of claim 11, wherein the gate insulation layer has a single-layered structure or a multi-layered structure.

13. The method of claim 12, wherein the gate insulation layer has the multi-layered structure, and layers constituting the gate insulation layer include materials having different etching characteristics.

14. The method of claim 13, wherein the gate insulation layer includes a first gate insulation layer and a second gate insulation layer, and
etching the gate insulation layer includes etching only the second gate insulation layer.

15. The method of claim 14, wherein the second gate insulation layer has a thickness ranging from about 20 nm to about 100 nm.

16. The method of claim 13, wherein forming the gate insulation layer comprises:
forming a first gate insulation layer including hafnium (Hf) oxide on the substrate and the gate; and
forming a second gate insulation layer on the first gate insulation layer.

17. The method of claim 13, wherein forming the gate insulation layer comprises:
forming a first gate insulation layer on the substrate and the gate; and
forming a second gate insulation layer including silicon (Si) oxide or Si nitride on the first gate insulation layer.

18. The method of claim 17, wherein etching the gate insulation layer includes etching only the second gate insulation layer using buffered oxide etchant (BOE).

19. The method of claim 11, wherein the gate insulation layer is etched to a depth ranging from about 20 nm to about 100 nm.

* * * * *